United States Patent [19]

Yanase et al.

[11] Patent Number: 4,629,532
[45] Date of Patent: Dec. 16, 1986

[54] METHOD OF GROWING INGAASP ON INP SUBSTRATE WITH CORRUGATION

[75] Inventors: Tomoo Yanase; Ikuo Mito, both of Tokyo, Japan

[73] Assignee: NEC Corporation, Tokyo, Japan

[21] Appl. No.: 634,329

[22] Filed: Jul. 25, 1984

[30] Foreign Application Priority Data

Jul. 28, 1983 [JP] Japan .................... 58-137988

[51] Int. Cl.$^4$ ............................. C30B 25/02
[52] U.S. Cl. ...................... 156/612; 156/DIG. 89; 372/96
[58] Field of Search ............... 372/96, 45; 156/612, 156/DIG. 111, DIG. 89, 655; 427/87

[56] References Cited

PUBLICATIONS

Ha Gai et al, Japanese Jl of Applied Physics, v 22, No. 5, 5/83, pp. L291–L293.
Kinoshita et al, Electronic Letters, 3/17/83, v 19, No. 6, pp. 215–216.
Sakai et al, IEEE Journal of Quantum Electronics, v QE-18, No. 8, 8/82.
Poi et al, Applied Phys Lett, 34(61), 3/15/79, pp. 393–395.
Clawson et al, Jl of Crystal Growth 46 (1979) 300–303.
Pigiuseppei et al, Jl of Crystal Growth 58 (1982) pp. 279–284.

Primary Examiner—Hiram H. Bernstein
Attorney, Agent, or Firm—Sughrue, Mion, Zinn, Macpeak, and Seas

[57] ABSTRACT

A method of growing an InGaAsP layer on a corrugated InP substrate as a part of a procedure for producing a DFB semiconductor laser includes the step of heating the substrate up to temperatures approaching 700° C. while holding the substrate in an atmosphere which contains arsine and phosphine. The substrate is subsequently moved to InGaAsP and InP growth chambers for growth of these respective layers. The method of the invention is advantageous in that the corrugated structure of the substrate is maintained intact throughout the procedure.

9 Claims, 4 Drawing Figures

METHOD OF GROWING INGAASP ON INP SUBSTRATE WITH CORRUGATION

BACKGROUND OF THE INVENTION

The present invention relates to a method of growing an InGaAsP crystal on an InP substrate.

A semiconductor laser of the type using an InP substrate and an InGaAsP active layer has recently been found to have excellent characteristics as a light source for optical fiber communications. The lasing wavelength of a semiconductor laser of the type described may be freely chosen within the range of 1.1-1.65 microns, a small loss wavelength range of optical fibers, by suitably selecting the composition ratio of InGaAsP. However, a detailed analysis of the lasing wavelengths of double-hetero structure semiconductor lasers which use the above-mentioned material shows that they undesirably oscillate in a plurality of axial modes at the same time or that, if oscillating in a single axial mode, they change to another axial mode with the lapse of time. It follows that where such a semiconductor laser oscillating at a wavelength near 1.5 microns (a wavelength providing a minimum optical fiber loss) is used, the pulse width of a pulse signal is increased while the signal propagates through the optical fiber, because the wavelength dispersion of the optical fiber is substantial at that wavelength. The increase in pulse width prevents high-speed communications.

An approach heretofore proposed to solve the problem discussed above is a distributed feedback (DFB) semiconductor laser. As shown in FIG. 1, the DFB laser has an InP substrate 11 and an InGaAsP guiding layer 12 adjoining each other along an interface 15 which has periodic corrugation. An InGaAsP active layer 13 which emits a laser beam is deposited on the guiding layer 12. Deposited on the active layer 13 are a cladding layer 14 for confining carriers and light. The layered structure shown in FIG. 1 is a basic structure and various modifications have been proposed. Typical of these modifications are the formation of another guiding layer between the InGaAsP active layer 12 and the InP cladding layer 14, the positioning of such a layered structure upside down, the depositing of a contact layer on the InP cladding layer 14, and the localization of the periodic corrugation of the interface 15. In the basic structure shown in FIG. 1, among the various light components propagating through the guiding layer 12, that one which satisfies Bragg's condition, which is determined by the period of the corrugation, is reflected and only a single axial mode which satisfies the condition can selectively lase.

The problematic situation with the manufacture of such a DFB laser is that a sufficient depth cannot be afforded for the periodic corrugation and an effort to form a sufficiently deep corrugation results in a limited emission efficiency.

In detail, the periodic corrugation is formed by an ordinary photoetching technique. This process is capable of forming a periodic corrugation which is as deep as 1,500 Å without any problem. This is followed by epitaxial growth of the InGaAsP guiding layer 12 on the so corrugated InP substrate, and it has been found that this step shallows the corrugation. It has also been found that where the epitaxial growth is effected in such a manner as to preserve the corrugation, the resulting InGaAsP active layer is quite poor in crystal quality and, therefore, in emission efficiency.

Presumably, the decrease in the depth of the corrugation is accounted for by the occurrence of volatilization while the temperature is elevated to 600°-700° C. which is essential for epitaxial growth. Particularly, the projections or ridges of the substrate are volatilized and deposited in the recesses which alternate with the projections.

With liquid phase epitaxial growth, a method has been proposed which prevents the volatilization of the projections of the substrate by covering the top of the InP substrate with an InP wafer to set up an atmosphere of phosphorus vapor, as disclosed in K. Sakai et al. "1.5 microns Range InGaAsP/InP Distributed Feedback Lasers", IEEE JOURNAL OF QUANTUM ELECTRONICS, VOL. QE-18, No. 8, 1982, pp. 1272-1278. There has also been proposed a method which adds phosphine in order to set up a sufficiently high vapor pressure, as described in N. Nagai et al. "Prevention of Surface Corrugation Thermal Deformation for InGaAsP/InP DFB Lasers", JAPANESE JOURNAL OF APPLIED PHYSICS, VOL. 22, No. 5, 1983, pp. L291-L283. These methods made it possible to form desired corrugations with hardly any decrease in depth so long as the temperature is not higher than 620° C. 620° C., however, is lower than the optimum temperature for epitaxial growth. Since the optimum temperature is 700° C. for vapor phase epitaxy (VPE) and 650° C. for liquid phase epitaxy (LPE), the epitaxial growth at a temperature on the order of 620° C. lowers the crystallizability of the InGaAsP active layer and, thereby, the emission efficiency.

Another proposal heretofore made uses a GaAs wafer in place of the InP wafer, as taught in J. Kinoshita el al. "Preserving InP Surface Corrugations for 1.3 microns GaInAsP/InP DFB Lasers from Thermal Deformation during LPE Process", ELECTRONICS LETTERS VOL. 19, No. 6, p. 215. In accordance with this method, the vapor of arsenic (As), instead of the phosphorus vapor, protects the corrugated substrate. This method allows the temperature to be elevated up to about 620° C. without reducing the corrugation depth. Nevertheless, upon elevation of the temperature beyond 620° C., the substrate surface becomes susceptive to thermal damage due to the absence of phosphorus vapor; moreover, the available amount of As vapor is insufficient. This method, like the above discussed one, tends to reduce the corrugation depth and offers only limited crystalizability of the InGaAsP active layer and, thereby, only a limited emission efficiency. Further, Mito, one of the inventors of the present invention, found that the use of a GaAsP wafer as a protective substrate is effective (Japanese Patent Application No. 58-116341/1983). However, even the protective GaAsP wafer cannot set up a sufficient phosphorus and arsenic vapor pressure in a temperature range of 650° to 700° C., which is suitable for epitaxial growth, resulting in thermal damage to the surface 15 of the corrugated substrate which reduces the corrugation depth as previously mentioned.

SUMMARY OF THE INVENTION

It is therefore an object of the present invention to provide a method which allows an InGaAsP guiding layer and the like to be deposited on an InP substrate, which has a periodic corrugation in a guiding layer, while preserving a sufficient depth of the periodic corrugation.

DETAILED DESCRIPTION OF THE PREFERRED EMBODIMENTS

Figure 1:
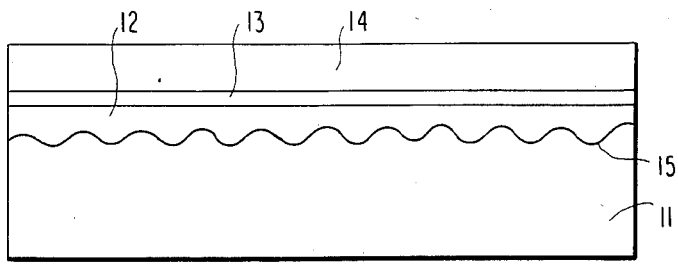
FIG. 1 is a sectional view of an ordinary DFB semiconductor laser.

In a first embodiment of the present invention, the InGaAsP guiding layer 12 of FIG. 1 is grown by vapor phase epitaxy on an InP substrate 11 having the previously discussed corrugation while sufficiently preserving the corrugation, and then the InGaAsP active layer 13 and the InP cladding layer 14 are sequentially deposited.

Figure 2:
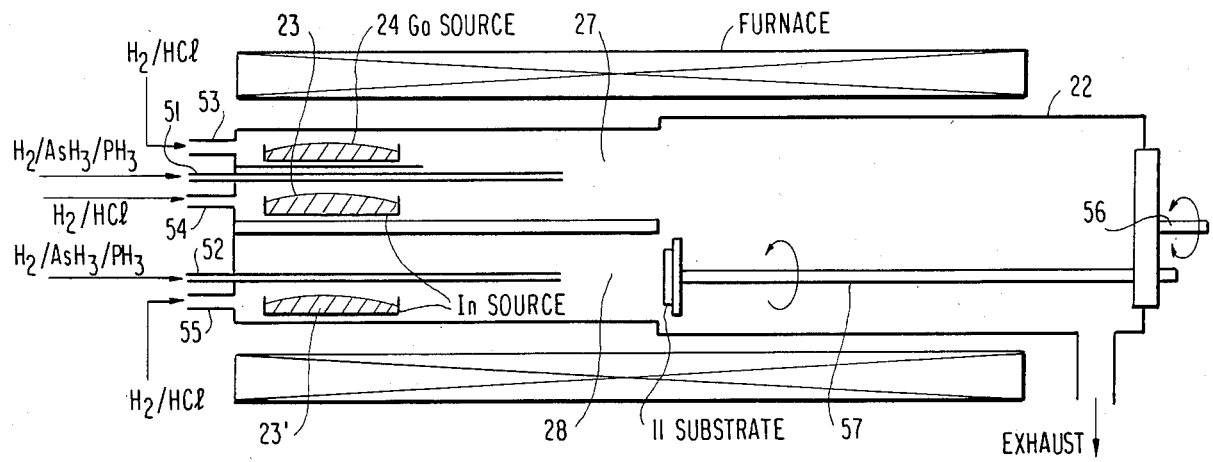
FIG. 2 is a schematic view of an apparatus for vapor phase epitaxy which is applicable to a first embodiment of the present invention.

Referring to FIG. 2, a method of the present invention will be described. While the process is underway, various parameters such as the temperature inside a vapor phase reaction tube, the presence of gaseous components and their flow rate are individually controlled to the values shown in Table 1. In the first step, the InP substrate 11, which has a corrugation which is as deep as 1,500 Å and a period of about 4,000 Å, is supported by a substrate holder inside an InP growth chamber, or holding chamber, 28 defined in a vapor phase reaction tube 22 and is kept in rotation by a substrate rotating member 57. The rotation of the substrate 11 is effected so that the substrate 11 may be uniformly exposed to the stream of gases to form a highly even growth layer, the rotation continuing until the end of this process. The first step takes about 30 seconds to complete and, during this period of time, the substrate temperature rises from room temperature to 700° C. In the meantime, the interior of the InP growth chamber 28 is filled with a gaseous mixture of arsine fed at a rate of 5 cc/min., phosphine fed at a rate of 10 cc/min., and hydrogen fed at a rate of 2,500 cc/min., as shown in Table 1, the mixture being supplied via inlets 52 and 55. During this period of time, the InGaAsP growth chamber 27 is supplied with gases in a composition which will allow the InGaAsP guiding layer 12 to grow in the second step. The purpose of this is to develop a growth atmosphere before growth actually begins in view of the fact that a certain period of time is necessary for the gas composition to become constant. Flowing through an inlet 53 into the InGaAsP growth chamber 27 at this time are hydrogen at a flow rate of 1,000 cc/min. and hydrochloric acid at a flow rate of 0.2 cc/min., flowing through an inlet 51 are hydrogen at a flow rate of 500 cc/min., arsine at a flow rate of 1.4 cc/min. and phosphine gas at a flow rate of 2.6 cc/min., and flowing through an inlet 54 are hydrogen at 1,000 cc/min. and hydrochloric acid at 3.8 cc/min. Under such conditions, the temperature could be elevated up to the growth temperature, 700° C., without causing any decrease in the depth of the corrugation of the InP substrate 11. This is presumably because arsine was decomposed by the high temperature to cause arsenic to be absorbed by the InP substrate surface and the resultant InAs film protected the corrugated substrate due to its vapor pressure higher than the InP substrate surface.

In the second step, the InP substrate 11 heated in the InP growth chamber 28 is shifted into the InGaAsP growth chamber 27 by a substrate moving machine 56. In this step, the InGaAsP guiding layer 12 having an energy gap of 0.95 electron-volts is grown on the InP substrate. This step continues for one minute. During this time, the substrate was kept at 700° C. The flow rates of the gases then flowing into the chamber 27 are the same as in the first step. Hydrochloric acid which enters the chamber 27 via the inlet 53 at a flow rate of 0.2 cc/min. reacts with a gallium melt 24 to form gallium chloride, while hydrochloric acid entering the chamber 27 via the inlet 54 at a flow rate of 3.8 cc/min. reacts with an indium melt 23 to turn into indium chloride. These gases in turn react with arsine and phosphine which are fed through the inlet 51 at flow rates of 1.4 cc/min. and 2.6 cc/min., respectively. As a result, the InGaAsP guiding layer 12 is epitaxially grown on the substrate with desirable crystalizability. The corrugation at the interface between the InP substrate 11 and the InGaAsP guiding layer 12 remains substantially as deep as before the growth of the InGaAsP guiding layer 12.

In the third step, the InP substrate is shifted from the InGaAsP growth chamber 27 to the InP growth chamber 28. The flow rate ratio between the gases is changed such that the gas composition in the chamber 27 turns into an InGaAsP composition which emits light at 1.55 microns. In the meantime, the substrate is held for 1 minute in the chamber 28. During this time, the temperature is kept at 700° C. The flow rates of the gases then entering the chambers 27 and 28 are shown in Table 1, STEP 3. In the fourth step, the substrate is shifted to the InGaAsP growth chamber 27. In the chamber 27, the InGaAsP active layer 13 is grown. Hydrochloric acid which enters the chamber 27 via the inlet 53 at a flow rate of 0.4 cc/min. reacts with the gallium melt 24 to form gallium chloride, while hydrochloric acid entering the chamber 27 via the inlet 54 at a flow rate of 3.65 cc/min. reacts with the indium melt 23 to form indium chloride. These gases in turn react with arsine and phosphine which are entering the chamber 27 via the inlet 51 at flow rates of 3.6 cc/min. and 0.4 cc/min., respectively. The resulting InGaAsP active layer 12 grown by epitaxy exhibits good crystalizability and emits light at 1.55 microns. In the meantime, the gases flowing into the InP growth chamber 28 via the inlets 52 and 55 are changed in composition and flow rate as shown in Table 1, STEP 4.

In the fifth step, when the substrate is moved into the InP growth chamber 28, the InP cladding layer 14 is grown. During this time, the temperature is kept at 700° C. The flow rates of the gases then entering the chambers 27 and 28 are shown in Table 1, step 5. Hydrochloric acid which enters the chamber 28 via the inlet 55 at a flow rate of 4.0 cc/min. reacts with an indium melt 23' to form indium chloride. This gas reacts with phosphine which is fed through the inlet 52 at a flow rate of 4.0 cc/min. In the sixth and final step, the substrate is cooled to room temperature.

TABLE 1

| STEP | SUBSTRATE POSITION | TIME (min.) | SUBSTRATE TEMPERATURE (°C.) | GAS FLOW RATE IN InP GROWTH CHAMBER 28 (cc/min.) | | | | |
|------|--------------------|-----|---------------------|---------|---------|-----------|---------|--------------|
| | | | | INLET 52 | | | INLET 55 | |
| | | | | HYDROGEN | ARSINE | PHOSPHINE | HYDROGEN | HYDROCHLORIC ACID |
| 1ST STEP | InP growth chamber 28 | 30 | room temperature ↓ 700 | 500 | 5 | 10 | 2000 | 0 |
| 2ND STEP | InGaAsP growth chamber 27 | 1 | 700 | 500 | 5 | 10 | 2000 | 0 |
| 3RD STEP | InP growth chamber 28 | 1 | 700 | 500 | 5 | 10 | 2000 | 0 |
| 4TH STEP | InGaAsP growth chamber 27 | 1 | 700 | 500 | 0 | 4 | 2000 | 4 |
| 5TH STEP | InP growth chamber 28 | 7 | 700 | 500 | 0 | 4 | 2000 | 4 |
| 6TH STEP | InP growth chamber 28 | 60 | 700 ↓ room temperature | 500 | 0 | 10 | 2000 | 0 |

| | GAS FLOW RATE IN InGaAsP GROWTH CHAMBER 27 (cc/min.) | | | | | | |
|------|----------|--------------|----------|--------|-----------|----------|--------------|
| | INLET 53 | | INLET 51 | | | INLET 54 | |
| STEP | HYDROGEN | HYDROCHLORIC ACID | HYDROGEN | ARSINE | PHOSPHINE | HYDROGEN | HYDROCHLORIC ACID |
| 1ST STEP | 1000 | 0.2 | 500 | 1.4 | 2.6 | 1000 | 3.8 |
| 2ND STEP | 1000 | 0.2 | 500 | 1.4 | 2.6 | 1000 | 3.8 |
| 3RD STEP | 1000 | 0.35 | 500 | 3.6 | 0.4 | 1000 | 3.65 |
| 4TH STEP | 1000 | 0.35 | 500 | 3.6 | 0.4 | 1000 | 3.65 |
| 5TH STEP | 1000 | 0 | 500 | 0 | 0 | 1000 | 0 |
| 6TH STEP | 1000 | 0 | 500 | 0 | 0 | 1000 | 0 |

A DFB semiconductor laser produced by the above procedure preserved a sufficiently deep corrugation at the interface between the InP substrate and the InGaAsP layer and, thereby, achieved high diffraction efficiency in its guiding layer. The laser with such a feature succeeded in stably lasing in a single axial mode and with high emission efficiency.

Figure 3:
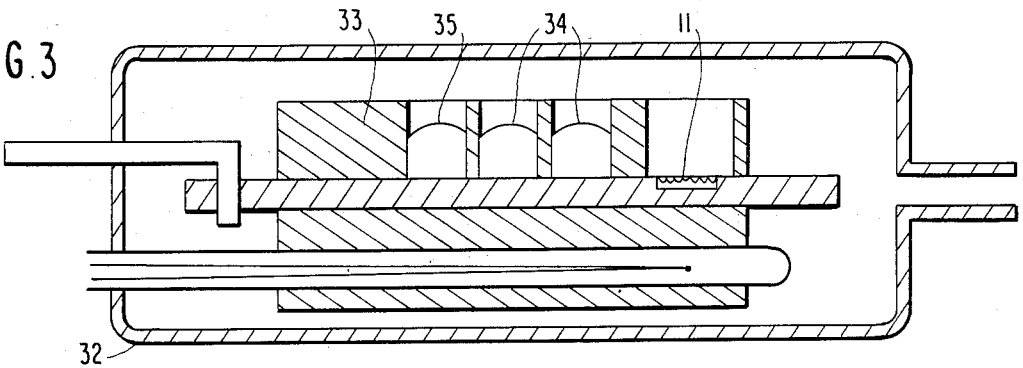
FIG. 3 is a schematic view of an apparatus for liquid phase epitaxy applicable to a second embodiment of the present invention.

Referring to FIG. 3, a second embodiment of the present invention will be explained which is applicable to liquid phase epitaxy. The arrangement shown in FIG. 3 represents a method of growing on an InP substrate 11 the InGaAsP guiding layer 12, InGaAsP active layer 13 and InP cladding layer 14. The corrugated InP substrate 11 is placed in a carbon boat 33 and, until heated up to the growth temperature, it is held in a first region of liquid phase reaction tube 32. When the temperature elevation is effected with the reaction tube 32 filled with a gaseous mixture of phosphine and arsine, the growth temperature, 650° C., will be reached without affecting the corrugation depth of the InP substrate. Thereafter, when the arsenic absorbed InP substrate 11 is moved to beneath a melt 34, an InGaAsP guiding layer with high crystalizability is grown by epitaxy on the substrate 11. The substrate 11 is disposed on a slider (no numeral) which is pulled to the left in the drawing to cause the active layer to be grown using an InGaAsP melt 36, and then the cladding layer is grown using an InP melt 35. The DFB laser thus produced, like the laser in accordance with the first embodiment, will lase stably in a single axial mode and with a high emission efficiency.

Figure 4:
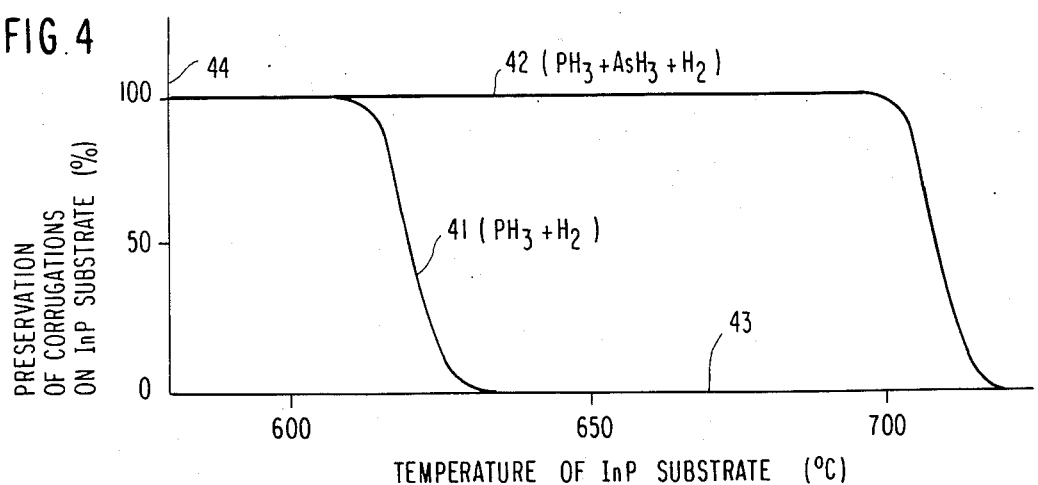
FIG. 4 illustrates curves representative of effects attainable with the prior art method and the method of the present invention.

The result achieved with the present invention will be described with reference to FIG. 4. In FIG. 4, the abscissa indicates the temperature of a corrugated substrate and the ordinate, the quantity of preserved corrugation in percentage. Curve 41 represents the relationship between the temperature and the preservation of the corrugation as obtained with the prior art method, which leaves the substrate in a gaseous mixture of phosphine (10 cc/min.) and hydrogen (2,500 cc/min.) As shown, the use of the prior art method sharply reduced the corrugation depth as the temperature was elevated beyond 630° C. Curve 42 represents the result achieved with the method of the present invention which employs a gaseous mixture of arsine (5 cc/min.), phosphine (10 cc/min.) and hydrogen (2,500 cc/min.); the corrugation depth was hardly reduced up to temperature of 700° C. Further, a DFB laser produced by elevating the temperature in an atmosphere containing both arsine and phosphine and then effecting vapor phase epitaxy, was successful lasing in stably in a single axial mode and with high emission efficiency.

What is claimed is:

1. A method of growing an InGaAsP layer on an InP substrate having a periodic corrugation on a surface thereof, comprising the steps of heating the InP substrate up to a growth temperature in the range of 650° C. to 700° C. while holding said InP substrate in an atmosphere which contains at least phosphine and arsine in a sufficient amount, and for a sufficient duration of time such as to form an arsenic absorbed InP substrate, and subsequently causing crystal growth of InGaAsP on said arsenic absorbed InP substrate.

2. A method as claimed in claim 1, wherein said corrugation is as deep as 1500 Å.

3. A method as claimed in claim 1, wherein said substrate is rotated during at least said heating step.

4. A method as claimed in claim 1, wherein the growth of InGaAsP is carried out in an InGaAsP growth chamber to which said substrate is transported following said heating step, and wherein an InGaAsP growth atmosphere is developed in said InGaAsP growth chamber during said heating step.

5. A method as claimed in claim 4, further comprising transporting said substrate to an InP growth chamber subsequent to said growth of InGaAsP, and thence to said InGaAsP growth chamber for the growth of an InGaAsP active layer.

6. A method as claimed in claim 5, further comprising cladding said InGaAsP active layer with an InP cladding layer grown in said InP growth chamber.

7. A method as claimed in claim 1, wherein arsine and phosphine are supplied during said heating step at a rate of 5 cc/min and 10 cc/min., respectively.

8. A method of producing a distributed feedback semiconductor laser, comprising the steps of;
providing an InP substrate;
etching a periodic corrugation into a surface of said substrate;
heating said substrate to a temperature ranging approximately between 650°–700° C. in an atmosphere containing at least arsine and phosphine;
growing an InGaAsP active layer on said guiding layer; and
growing an InP cladding layer on said active layer.

9. A method as claimed in claim 8, wherein arsine and phosphine are supplied during said heating step in amounts sufficient to permit said substrate to be heated to a temperature of 700° C. while at least substantially completely preserving the structure of said corrugation.

* * * * *